United States Patent
Bowman et al.

(10) Patent No.: US 9,413,344 B2
(45) Date of Patent: Aug. 9, 2016

(54) AUTOMATIC CALIBRATION CIRCUITS FOR OPERATIONAL CALIBRATION OF CRITICAL-PATH TIME DELAYS IN ADAPTIVE CLOCK DISTRIBUTION SYSTEMS, AND RELATED METHODS AND SYSTEMS

(71) Applicant: QUALCOMM Incorporated, San Diego, CA (US)

(72) Inventors: Keith Alan Bowman, Morrisville, NC (US); Jeffrey Todd Bridges, Raleigh, NC (US); Sarthak Raina, Raleigh, NC (US); Yeshwant Nagaraj Kolla, Wake Forest, NC (US); Jihoon Jeong, Cary, NC (US); Francois Ibrahim Atallah, Raleigh, NC (US); William Robert Flederbach, Holly Springs, NC (US); Jeffrey Herbert Fischer, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/668,041

(22) Filed: Mar. 25, 2015

(65) Prior Publication Data

US 2016/0072491 A1      Mar. 10, 2016

Related U.S. Application Data

(60) Provisional application No. 62/047,278, filed on Sep. 8, 2014.

(51) Int. Cl.
*H03H 11/26*      (2006.01)
*H03K 5/13*      (2014.01)
(Continued)

(52) U.S. Cl.
CPC .. *H03K 5/13* (2013.01); *G06F 1/10* (2013.01); *H03K 5/134* (2014.07); *H03K 5/156* (2013.01); *H03K 2005/00019* (2013.01)

(58) Field of Classification Search
CPC ............ H03K 5/13; H03K 5/131; H03K 5/14
USPC .......................... 327/261, 262, 276, 277, 284
See application file for complete search history.

(56) References Cited

U.S. PATENT DOCUMENTS

| 5,956,289 A | 9/1999 | Norman et al. |
| 6,232,806 B1 | 5/2001 | Woeste et al. |

(Continued)

FOREIGN PATENT DOCUMENTS

| EP | 2662791 A1 | 11/2013 | |
| WO | WO 2015161890 A1 * | 10/2015 | ................ G06F 1/08 |

OTHER PUBLICATIONS

Bowman, K. A. et al., "A 22 nm All-Digital Dynamically Adaptive Clock Distribution for Supply Voltage Droop Tolerance," IEEE Journal of Solid-State Circuits, vol. 48, No. 4, Apr. 2013, IEEE, pp. 907-916.

(Continued)

*Primary Examiner* — William Hernandez
(74) *Attorney, Agent, or Firm* — Withrow & Terranova, PLLC

(57) ABSTRACT

Automatic calibration circuits for operational calibration of critical-path time delays in adaptive clock distribution systems, and related methods and systems, are disclosed. The adaptive clock distribution system includes a tunable-length delay circuit to delay distribution of a clock signal provided to a clocked circuit, to prevent timing margin degradation of the clocked circuit after a voltage droop occurs in a power supply supplying power to the clocked circuit. The adaptive clock distribution system also includes a dynamic variation monitor to reduce frequency of the delayed clock signal provided to the clocked circuit in response to the voltage droop in the power supply, so that the clocked circuit is not clocked beyond its performance limits during a voltage droop. An automatic calibration circuit is provided in the adaptive clock distribution system to calibrate the dynamic variation monitor during operation based on operational conditions and environmental conditions of the clocked circuit.

29 Claims, 9 Drawing Sheets

(51) Int. Cl.
*G06F 1/10* (2006.01)
*H03K 5/156* (2006.01)
*H03K 5/134* (2014.01)
*H03K 5/00* (2006.01)

(56) References Cited

U.S. PATENT DOCUMENTS

| | | | | |
|---|---|---|---|---|
| 6,922,111 | B2* | 7/2005 | Kurd | G06F 1/10 331/48 |
| 8,019,957 | B1 | 9/2011 | White et al. | |
| 8,046,185 | B1 | 10/2011 | Chui | |
| 8,121,237 | B2 | 2/2012 | Stott et al. | |
| 2003/0117175 | A1 | 6/2003 | Green et al. | |
| 2004/0155690 | A1 | 8/2004 | Andrews et al. | |
| 2004/0183613 | A1* | 9/2004 | Kurd | G01K 7/32 331/186 |
| 2007/0214377 | A1 | 9/2007 | Jarrar et al. | |
| 2010/0039152 | A1* | 2/2010 | Takano | H03K 5/13 327/250 |

OTHER PUBLICATIONS

Jiao, D. et al., "A Programmable Adaptive Phase-Shifting PLL for Clock Data Compensation Under Resonant Supply Noise," 2011 IEEE International Solid-State Circuits Conference Digest of Technical Papers (ISSCC), Feb. 20-24, 2011, San Francisco, CA, IEEE, pp. 272-274.

Tokunaga, C. et al., "A Graphics Execution Core in 22nm CMOS Featuring Adaptive Clocking, Selective Boosting and State-Retentive Sleep," 2014 IEEE International Solid-State Circuits Conference Digest of Technical Papers (ISSCC), Feb. 9-13, 2014, San Francisco, CA, IEEE, pp. 108-109.

Bowman, K. et al., "A 16nm Auto-Calibrating Dynamically Adaptive Clock Distribution for Maximizing Supply-Voltage-Droop Tolerance Across a Wide Operating Range," 2015 IEEE International Solid-State Circuits Conference (ISSCC), Feb. 22-26, 2015, San Francisco, CA, IEEE, 3 pages.

Bowman, K. A. et al., "A 22 nm Dynamically Adaptive Clock Distribution for Voltage Droop Tolerance," 2012 Symposium on VLSI Circuits, Jun. 13-15, 2012, Honolulu, HI, IEEE, pp. 94-95.

Fischer, T. et al., "A 90-nm Variable Frequency Clock System for a Power-Managed Itanium Architecture Processor," IEEE Journal of Solid-State Circuits, vol. 41, No. 1, Jan. 2006, IEEE, pp. 218-228.

Grenat, A. et al., "Adaptive Clocking System for Improved Efficiency in a 28nm x86-64 Microprocessor," 2014 IEEE International Solid-State Circuits Conference Digest of Technical Papers (ISSCC), Feb. 9-13, 2014, San Francisco, CA, IEEE, pp. 106-107.

Kurd, N. et al., "Next Generation Intel® Core™ Micro-Architecture (Nehalem) Clocking," IEEE Journal of Solid-State Circuits, vol. 44, No. 4, Apr. 2009, IEEE, pp. 1121-1129.

Wu, S.-Y. et al., "A 16nm FinFET CMOS Technology for Mobile SoC and Computing Applications," 2013 IEEE International Electron Devices Meeting (IEDM), Dec. 9-11, 2013, Washington, DC, IEEE, pp. 9.1.1-9.1.4.

Invitation to Pay Additional Fees and Partial Search Report for PCT/US2015/046512, mailed Dec. 4, 2015, 11 pages.

International Search Report and Written Opinion for PCT/US2015/046512, mailed Mar. 21, 2016, 27 pages.

* cited by examiner

AUTOMATIC CALIBRATION CIRCUITS FOR OPERATIONAL CALIBRATION OF CRITICAL-PATH TIME DELAYS IN ADAPTIVE CLOCK DISTRIBUTION SYSTEMS, AND RELATED METHODS AND SYSTEMS

PRIORITY APPLICATION

The present application claims priority to U.S. Provisional Patent Application Ser. No. 62/047,278 filed on Sep. 8, 2014 and entitled "AUTOMATIC CALIBRATION CIRCUITS FOR IN-FIELD, OPERATIONAL CALIBRATION OF CRITICAL-PATH TIME DELAYS IN ADAPTIVE CLOCK DISTRIBUTION SYSTEMS, AND RELATED METHODS AND SYSTEMS," the contents of which is incorporated herein in its entirety.

BACKGROUND

I. Field of the Disclosure

The technology of the disclosure relates generally to monitoring circuits for monitoring a power supply to determine if a power supply voltage has drooped, and adaptively changing the performance of a powered circuit powered by the power supply in response to compensate for the voltage droop.

II. Background

Circuits such as central processing units (CPUs) or digital signal processors (DSPs) require power to operate. In this regard, a power supply provides a supply voltage to a powered circuit. During normal operation of a circuit, a power supply may undergo a voltage droop. FIG. 1 is a graph illustrating an example of a power supply voltage droop 100 occurring in a supply voltage 102. As shown in FIG. 1, the power supply voltage droop 100 is a temporary drop or reduction (e.g., 10 nanoseconds (ns)) in the power supply voltage 102 being supplied by a power supply. Such behavior may be associated with a switching power supply. Reasons for the power supply voltage droop 100 may include an abrupt increase in demand in power supply current supplied by the power supply, inducing large current transients in a power delivery system, and/or an operational change to the power supply. The magnitude and duration of a voltage droop of a power supply depends on the interaction of capacitive and inductive parasitics at board, package, and die levels with changes in current demand. Thus, voltage droops affect circuits globally across a die and may occur with frequencies ranging in delay from a few nanoseconds (ns) (i.e., high frequency) to a few microseconds (ms) (i.e., low frequency).

High-frequency voltage droops may result in the largest power supply voltage magnitude change, and thus have a severe impact on powered circuit performance and energy efficiency. For example, a CPU that executes instructions may be a powered circuit that is powered by a high frequency switching power supply. In a CPU, typical current consumption may be on the order of hundreds of milliamps (mA) to one (1) amp (A). If for example, the CPU executes back-to-back complex instructions (e.g., hardware multiplies), current consumption may quickly change at about one (1) amp (A) per nanosecond (ns), thereby causing a power supply voltage droop. As long as the voltage droop does not cause the voltage level provided by the power supply to the CPU to fall below the minimum acceptable operating voltage of the CPU, the CPU continues to function properly.

Thus, to compensate for voltage droop that can occur in a power supply supplying power to the CPU, a voltage operating margin (e.g., a voltage guardband) can be designed into the power supply. The voltage operating margin of a power supply is calculated as the difference between the worst-case supply voltage provided by the power supply during voltage droops and the minimum acceptable operating voltage of a powered circuit. The operating margin of the power supply voltage represents additional voltage that must be supplied to the powered circuit to assure proper circuit operation when power supply voltage droop events occur. However, since voltage droops events do not occur frequently, additional power is provided by the power supply to the powered circuit than what is required for the powered circuit to function properly during non-voltage droop times, thus inefficiently expending additional power.

Alternatively, a powered circuit could be configured to operate at a reduced performance level (e.g., reduce its operating frequency) to reduce its minimum acceptable operating voltage. Thus, when voltage droop occurs in the power supply, the powered circuit is already operating at a performance level that can be maintained at the voltage supplied by the power supply during the voltage droop. However, providing for a powered circuit to operate at a reduced performance level to compensate for infrequent power supply voltage droops may also be undesired.

SUMMARY OF THE DISCLOSURE

Aspects disclosed in the detailed description include automatic calibration circuits for operational calibration of critical-path time delays in adaptive clock distribution systems. Related methods and systems are also disclosed. In one aspect, an adaptive clock distribution system is provided that receives a clock signal to be distributed to clocked circuits. The adaptive clock distribution system includes a tunable-length delay circuit. The tunable-length delay circuit is configured to delay distribution of the clock signal provided to a clocked circuit. Delaying distribution of the clock signal provides a response time for detecting the voltage droop and adapting the clock signal frequency by postponing the otherwise timing degradation of the clocked circuit after voltage droop occurs in a power supply supplying power to the clocked circuit. The adaptive clock distribution system also includes a dynamic variation monitor. The dynamic variation monitor is configured to detect the on-set of voltage droop in the power supply based on timing transitions in one or more tunable delay paths whose delay is based on critical-path delay timings in the clocked circuit. Additional delay margin is also provided in the tunable delay paths since the critical-path delay timings in the clocked circuit can vary based on process variations incurred during fabrication of the clocked circuit. The dynamic variation monitor is configured to interface with an adaptive control unit and clock divider logic to cause the frequency of the clock signal provided to the clocked circuit to be reduced in response to detection of voltage droop in the power supply, so that the clocked circuit is not clocked beyond its performance limitations during the voltage droop.

In additional aspects disclosed herein, an automatic calibration circuit is also provided in the adaptive clock distribution system. The automated calibration circuit is configured to calibrate the tunable delay paths in the dynamic variation monitor based on operational conditions (e.g., operating frequency and voltage) and environmental conditions (e.g., temperature) of the clocked circuit. For example, the automated calibration circuit may be configured to calibrate the tunable delay paths in the dynamic variation monitor based on operational conditions during in-field operation. By providing the automatic calibration circuit in the adaptive clock distribution system to provide operational calibration of the dynamic variation monitor, costly calibration time and overhead incurred with calibrating each adaptive clock distribution system during test over a wide range of operational and environmental conditions, or over a limited range of operational and environmental conditions during test to reduce calibration time, can be reduced or avoided.

Calibrating the tunable delay paths in the dynamic variation monitor reduces delay variations between critical-path delay timings in the clocked circuit and the tunable delay paths in the dynamic variation monitor without reducing accuracy in the dynamic variation monitor detecting the onset of a voltage droop based on timing transitions in a tunable delay path. Reducing delay variations between the critical-path delay timings in the clocked circuit and the tunable delay paths in the dynamic variation monitor allows the additional timing margin in the dynamic variation monitor to be reduced. Reducing the additional timing margin in the dynamic variation monitor increases the magnitude of the voltage droop mitigated by the adaptive clock distribution system, which increases throughput of the clocked circuit. Reducing the additional timing margin in the dynamic variation monitor to improve the effectiveness of the adaptive clock distribution system can also reduce energy consumption, because tasks will be completed faster by the clocked circuit due to the increased throughput of the clocked circuit.

In this regard in one aspect, an adaptive clock distribution system for delaying a clock signal provided to a clocked circuit is provided. The adaptive clock distribution system comprises a dynamic variation monitor. The dynamic variation monitor comprises a first clock signal input configured to receive a clock signal. The dynamic variation monitor also comprises a tunable delay circuit comprising a plurality of tunable delay paths each having a delay timing based on a critical-path delay timing in a clocked circuit. The tunable delay circuit further is configured to measure a timing margin between a clock signal period of the clock signal and a path delay of a data input signal delayed in a selected tunable delay path among the plurality of tunable delay paths based on a programmable delay path input. The adaptive clock distribution system also comprises a voltage droop detection circuit. The voltage droop detection circuit is configured to detect a voltage droop of a power supply supplying power to the clocked circuit, and generate a voltage droop output indicating a voltage droop event of a power supply, based on the measured timing margin between a period of the clock signal and the path delay of the data input signal. The adaptive clock distribution system also comprises an adaptive control circuit. The adaptive control circuit is configured to receive a first delayed clock signal comprised of a delayed clock signal of the clock signal on a second clock signal input. The adaptive control circuit is also configured to reduce a frequency of the first delayed clock signal to provide a reduced frequency delayed clock signal. The adaptive control circuit is also configured to receive the voltage droop output from the dynamic variation monitor. The adaptive control circuit is also configured to selectively provide the reduced frequency delayed clock signal on a second clock output to the clocked circuit if the voltage droop output indicates the voltage droop event. The adaptive control circuit is also configured to selectively provide the first delayed clock signal on the second clock output to the clocked circuit if the voltage droop output does not indicate the voltage droop event. The adaptive clock distribution system also comprises an automatic calibration circuit. The automatic calibration circuit is configured to generate the programmable delay path input to select the selected tunable delay path among the plurality of tunable delay paths in the dynamic variation monitor that produces a lower path timing margin of the clock signal period and the path delay of the data input signal in the dynamic variation monitor without the voltage droop event being generated on the voltage droop output.

In another aspect, an adaptive clock distribution system for delaying a clock signal provided to a clocked circuit is provided. The adaptive clock distribution system comprises a means for measuring a timing margin between a clock signal period of the clock signal and a path delay of a data input signal in a selected tunable delay path among a plurality of tunable delay paths each having a delay timing based on a critical-path delay timing in a clocked circuit, based on a programmable delay path input. The adaptive clock distribution system also comprises a means for detecting a voltage droop event on a voltage droop output indicating a voltage droop of a power supply supplying power to the clocked circuit, based on the measured timing margin between a period of the clock signal and the path delay of the data input signal. The adaptive clock distribution system also comprises a means for: receiving a first delayed clock signal comprised of a delayed clock signal of the clock signal on a second clock signal input, reducing a frequency of the first delayed clock signal to provide a reduced frequency delayed clock signal, selectively providing the reduced frequency delayed clock signal on a second clock output to the clocked circuit if the voltage droop output indicates the voltage droop event, and selectively providing the first delayed clock signal on the second clock output to the clocked circuit if the voltage droop output does not indicate the voltage droop event. The adaptive clock distribution system also comprises a means for providing the programmable delay path input to the means for measuring the timing margin to select the selected tunable delay path among the plurality of tunable delay paths in the means for measuring the timing margin that produces a lower path timing margin of the clock signal period and the path delay of the data input signal in the means for measuring the timing margin without the voltage droop event being generated by the means for detecting a voltage droop event.

In another aspect, a method of adaptively distributing a delayed clock signal to a clocked circuit is provided. The method comprises receiving a clock signal. The method also comprises measuring a timing margin of a clock signal period of the clock signal and a path delay of a data input signal in a selected tunable delay path among the plurality of tunable delay paths each having a delay timing based on a critical-path delay timing in a clocked circuit, based on a programmable delay path input. The method also comprises detecting a voltage droop event of a power supply supplying power to a clocked circuit. The method also comprises generating a voltage droop output indicating the voltage droop event based on the measured timing margin of a period of the clock signal and the path delay of the data input signal. The method also comprises selectively providing a reduced frequency delayed clock signal of the clock signal to the clocked circuit if the voltage droop output indicates the voltage droop event. The method also comprises selectively providing the first delayed clock signal on the second clock output to the clocked circuit if the voltage droop output does not indicate the voltage droop event. The method also comprises calibrating the plurality of tunable delay paths based on the programmable delay path input, based on the selected tunable delay path among the plurality of tunable delay paths that produces a lower path timing margin of the clock signal period and the path delay of the data input signal without the voltage droop event being generated on the voltage droop output. The method also comprises generating a programmable delay input to select the tunable delay path among the plurality of tunable delay paths monitor, during operation of the clocked circuit, based on the calibrating of the plurality of tunable delay paths.

DETAILED DESCRIPTION

Figure 1:
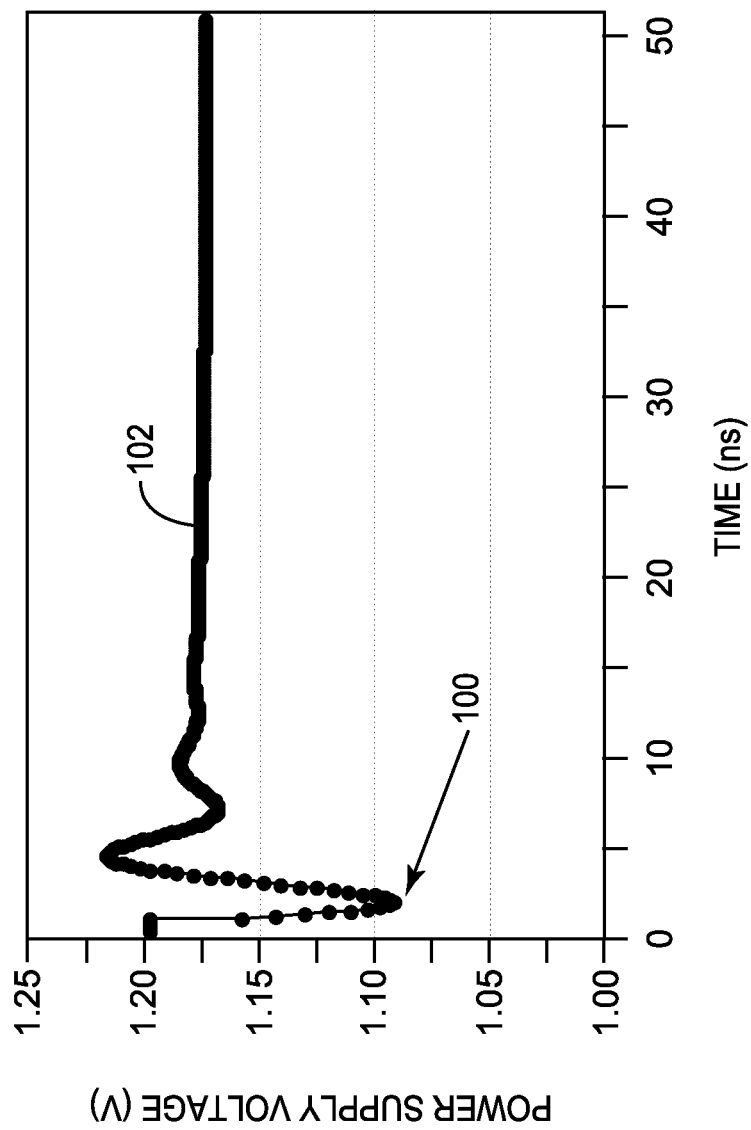
FIG. 1 is a graph of an exemplary power supply voltage droop occurring in a supply voltage supplied by a power supply.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include automatic calibration circuits for operational calibration of critical-path time delays in adaptive clock distribution systems. Related methods and systems are also disclosed. In one aspect, an adaptive clock distribution system is provided that receives a clock signal to be distributed to clocked circuits. The adaptive clock distribution system includes a tunable-length delay circuit. The tunable-length delay circuit is configured to delay distribution of the clock signal provided to a clocked circuit. Delaying distribution of the clock signal provides a response time for detecting the voltage droop and adapting the clock signal frequency by postponing the otherwise timing degradation of the clocked circuit after voltage droop occurs in a power supply supplying power to the clocked circuit. The adaptive clock distribution system also includes a dynamic variation monitor. The dynamic variation monitor is configured to detect the on-set of voltage droop in the power supply based on timing transitions in one or more tunable delay paths whose delay is based on critical-path delay timings in the clocked circuit. Additional delay margin is also provided in the tunable delay paths since the critical-path delay timings in the clocked circuit can vary based on process variations incurred during fabrication of the clocked circuit. The dynamic variation monitor is configured to cause the frequency of the clock signal provided to the clocked circuit to be reduced in response to detection of voltage droop in the power supply, so that the clocked circuit is not clocked beyond its performance limitations during the voltage droop.

In additional aspects disclosed herein, an automatic calibration circuit is also provided in the adaptive clock distribution system. The automated calibration circuit is configured to calibrate the tunable delay paths in the dynamic variation monitor based on operational conditions (e.g., operating frequency and voltage) and environmental conditions (e.g., temperature) of the clocked circuit. For example, the automated calibration circuit may be configured to calibrate the tunable delay paths in the dynamic variation monitor based on operational conditions during operation. By providing the automatic calibration circuit in the adaptive clock distribution system to provide operational calibration of the dynamic variation monitor, costly calibration time and overhead incurred with calibrating each adaptive clock distribution system during test over a wide range of operational and environmental conditions, or over a limited range of operational and environmental conditions during test to reduce calibration time, can be reduced or avoided.

Calibrating the tunable delay paths in the dynamic variation monitor reduces delay variations between critical-path delay timings in the clocked circuit and the tunable delay paths in the dynamic variation monitor without reducing accuracy in the dynamic variation monitor detecting the on-set of a voltage droop based on timing transitions in a tunable delay path. Reducing delay variations between the critical-path delay timings in the clocked circuit and the tunable delay paths in the dynamic variation monitor allows the additional timing margin in the dynamic variation monitor to be reduced. Reducing the additional timing margin in the dynamic variation monitor increases the magnitude of the voltage droop mitigated by the adaptive clock distribution system, which increases throughput of the clocked circuit. Reducing the additional timing margin in the dynamic variation monitor to improve the effectiveness of the adaptive clock distribution system can also reduce power consumption, because tasks will be completed faster by the clocked circuit due to the increased throughput of the clocked circuit.

In this regard, before discussing adaptive clock distribution systems that include automatic calibration circuits for calibrating tunable delay paths in a dynamic variation monitor during operation based on operational conditions (e.g., operating frequency and voltage) and environmental conditions (e.g., temperature) of the clocked circuit, an adaptive clock distribution system that does not include the automatic calibration circuit will be described with regard to FIGS. 2-4. Adaptive clock distribution systems that include automatic calibration circuits for calibrating tunable delay paths in a dynamic variation monitor during operation based on operational conditions (e.g., operating frequency and voltage) and environmental conditions (e.g., temperature) of the clocked circuit will be described later below beginning with FIG. 5.

Figure 2:
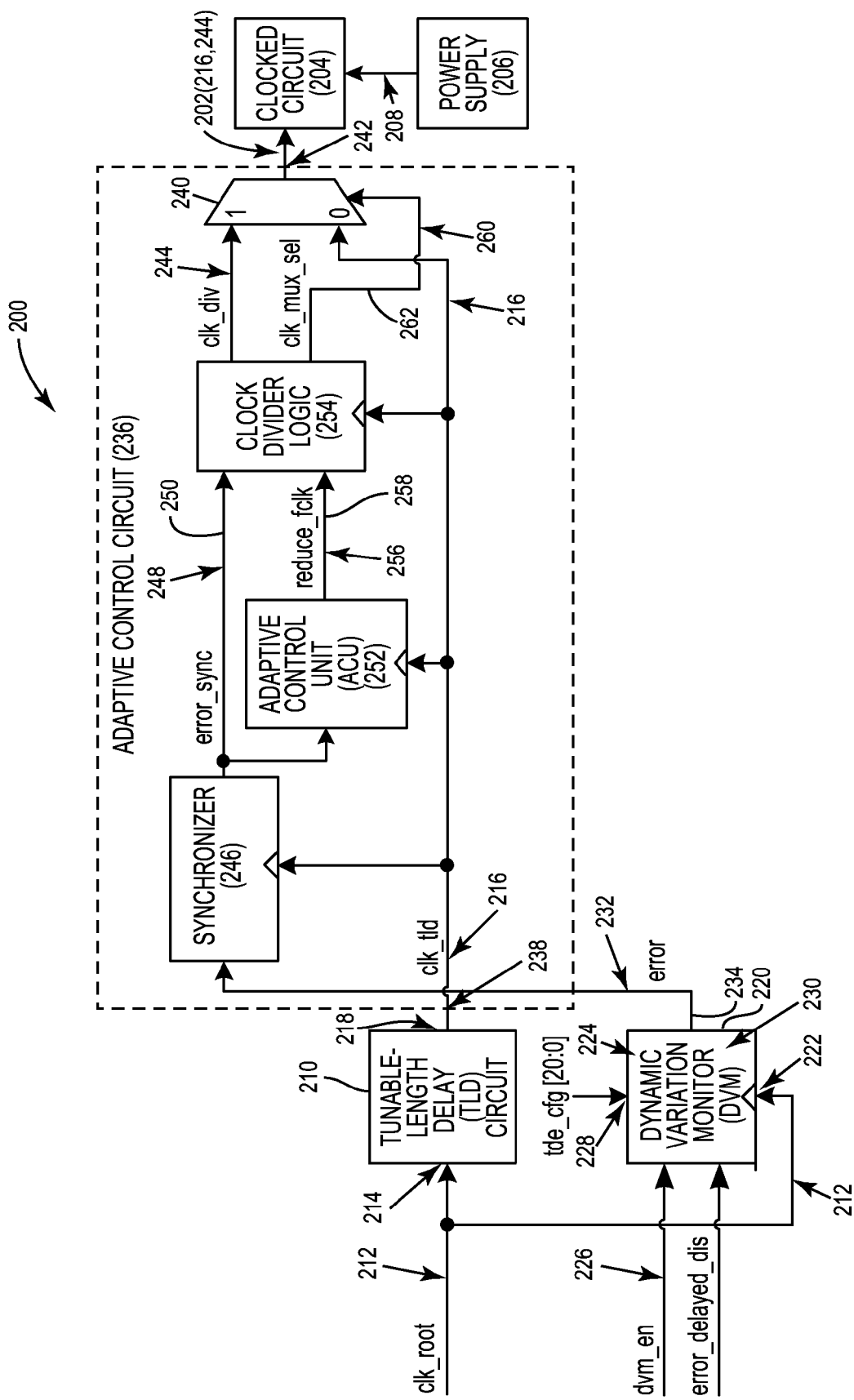
FIG. 2 is a block diagram of an exemplary adaptive clock distribution system for delaying the clock signal distribution to a clocked circuit based on the delay of the tunable-length delay (TLD) circuit, to allow a sufficient response time to detect voltage droops in a power supply supplying power to the clock circuit with the dynamic variation monitor and to adaptively change the clock frequency to the clocked circuit to prevent performance degradation in the clocked circuit.

In this regard, FIG. 2 is a block diagram of an exemplary adaptive clock distribution system 200 for distributing a delayed clock signal 202 to a clocked circuit 204 based on critical-path timings in the clocked circuit 204. This allows the adaptive clock distribution 200 a sufficient response time to detect and to adapt to voltage droops in a power supply 206 supplying a power signal 208 to the clocked circuit 204. For example, the power supply 206 may be a high frequency switching power supply that is configured to provide different operating voltages to the clocked circuit 204 for operation. As an example, the clocked circuit 204 may be a central processing unit (CPU) or other processor that executes instructions in clock cycles according to the delayed clock signal 202. For example, if a CPU as the clocked circuit 204 executes back-to-back complex instructions (e.g., hardware multiplies), current consumption of the CPU may quickly change at about one (1) amp (A) per nanosecond (ns), thereby causing a voltage droop in the power signal 208 generated by the power supply 206. High-frequency voltage droops in the power supply 206 may result in large voltage magnitude changes in the power signal 208, and thus have a severe impact on the performance of the clocked circuit 204 if the voltage of the power signal 208 drops below the minimum acceptable operating voltage of the clocked circuit 204.

Thus, with continuing reference to FIG. 2, the adaptive clock distribution system 200 includes a tunable-length delay circuit 210. The tunable-length delay circuit 210 is configured to receive a clock signal 212, which may be a clock root signal (clk_root), to be distributed to the clocked circuit 204. The tunable-length delay circuit 210 receives the clock signal 212 on a first clock signal input 214. The tunable-length delay circuit 210 is configured to delay the received clock signal 212 to provide a delayed clock signal 216 on a first clock signal output 218 to prevent timing degradation of the clocked circuit 204 after a voltage droop occurs in the power supply 206, which causes a voltage droop on the power signal 208.

With continuing reference to FIG. 2, the adaptive clock distribution system 200 also includes a dynamic variation monitor 220. As will be discussed in more detail below, the dynamic variation monitor 220 is configured to detect the on-set of voltage droop in the power supply 206 based on timing transitions in one or more tunable delay paths whose delay is based on critical-path delay timings in the clocked circuit 204. In this regard, the dynamic variation monitor 220 has a second clock signal input 222 configured to also receive the clock signal 212. The dynamic variation monitor 220 includes a tunable delay circuit 224 that comprises a plurality of tunable delay paths (discussed in more detail below in FIG. 3) each having a delay timing based on a critical path delay timing in the clocked circuit 204. Additional delay margin is also provided in the tunable delay paths of the dynamic variation monitor 220 since the critical-path delay timings in the clocked circuit 204 can vary based on process variations incurred during fabrication. As will be discussed in more detail in FIG. 3 when the dynamic variation monitor 220 is enabled by an enable signal 226, the dynamic variation monitor 220 is configured to delay the propagation of certain internal signals by a selected tunable delay path among the plurality of tunable delay paths, each having a delay timing based on a critical path delay timing in the clocked circuit 204. This causes the dynamic variation monitor delay paths to experience delay similar to what the critical paths in the clocked circuit 204 would experience if the clock signal 212 directly connected to the clocked circuit 204, since the plurality of tunable delay paths are based on the critical-path delay timing in the clocked circuit 204. For example, the adaptive clock distribution system 200 may be provided on the same die as the clocked circuit 204 so that the tunable delay paths in the dynamic variation monitor 220 will experience the same or similar process variations as the critical paths of the clocked circuit 204. The selected tunable delay path is based on a programmable delay path input 228.

As will also be discussed below in more detail in FIG. 3, the dynamic variation monitor 220 includes a voltage droop detection circuit 230. The voltage droop detection circuit 230 is configured to generate a voltage droop indication signal 232 on a voltage droop output 234 indicating if a voltage droop is occurring in the power supply 206, based on timing differences between the period of the input clock signal 212 and the total path delay of the selected tunable delay path in the dynamic variation monitor 220. With continuing reference to FIG. 2, the voltage droop output 234 is coupled to an adaptive control circuit 236. The delayed clock signal 216 generated by the tunable-length delay circuit 210 is also provided to a third clock signal input 238 of the adaptive control circuit 236. As will be discussed in more detail below with regard to FIG. 3, if the voltage droop output 234 does not indicate a voltage droop detected by the dynamic variation monitor 220 in the power supply 206, a clock signal selector 240 will select the delayed clock signal 216 to be provided on a second clock output 242 to the clocked circuit 204. In this scenario, the adaptive clock distribution system 200 provides the delayed clock signal 216 to prevent timing degradation of the clocked circuit 204 in case a voltage droop had previously occurred in the power supply 206. By the tunable-length delay circuit 210 deterministically postponing the critical-path delay degradation of the clocked circuit 204, the tunable-length delay circuit 210 allows a sufficient response time to allow the clocked circuit 204 to operate at the frequency of the clock signal 212. The design of the adaptive clock distribution system 200 also reacts to voltage droops. Since the adaptive clock distribution system 200 does not know when a voltage droop may occur, the clock signal 212 is always delayed. The purpose for delaying the clock signal 212 is to exploit the clock-data compensation effect to provide a response time for adaptively changing the clock frequency of the delayed clock signal 216 at the second clock output 242.

With continuing reference to FIG. 2, as voltage of the power signal 208 starts to droop, the delay through the tunable-length delay circuit 210 (TLD) and the datapath delay increase. Consequently, the clock period at the clock leaf node stretches and compensates for the longer datapath delay. This is the clock-data compensation effect. This effect, however, only occurs for the delay in the entire clock distribution. If the clock distribution delay is zero, then this effect does not happen. For example, if the clock distribution delay is 4 ns and the clock period is 1 ns (i.e., 1 GHz clock frequency), then four cycles of clock-data compensation will occur to provide four cycles of response time. However, if the voltage droop output 234 indicates a voltage droop detected by the dynamic variation monitor 220 in the power supply 206, the clock signal selector 240 will select a reduced-frequency delayed clock signal 244 to be provided on the second clock output 242 to the clocked circuit 204. The reduced-frequency delayed clock signal 244 is provided to the clocked circuit 204, because a voltage droop is presently occurring in the power supply 206. In this manner, the clocked circuit 204 is not clocked beyond its performance limits during the voltage droop of the power supply 206.

With continuing reference to FIG. 2, after the power signal 208 generated by the power supply 206 no longer experiences voltage droop, the dynamic variation monitor 220 will eventually generate the voltage droop output 234 indicating no voltage droop in the power supply 206. This will then cause the adaptive control circuit 236 to cause the clock signal selector 240 to provide the delayed clock signal 216 at the operating frequency of the clock signal 212 on the second clock output 242 to the clocked circuit 204 such that performance of the clocked circuit 204 is not reduced. But as discussed above, the delayed clock signal 216 is still delayed from the clock signal 212 to prevent timing degradation of the clocked circuit 204 for the voltage droop that just previously occurred in the power supply 206.

With continuing reference to FIG. 2, the adaptive control circuit 236 includes a synchronizer 246 that is coupled to the voltage droop output 234. The synchronizer 246 is configured to provide a synchronization error signal 248 on a synchronization error output 250 indicating the voltage droop output 234 from the dynamic variation monitor 220. The synchronization error signal 248 is provided to an adaptive control unit 252 and clock divider logic 254. The adaptive clock distribution integrates the tunable-length delay circuit 210 between a clock generator (not shown) that generates the clock signal 212 and the second clock output 242 for distribution of the delayed clock signal 202. The adaptive control unit 252 is configured to determine if the delayed clock signal 202 should be provided as the reduced-frequency delayed clock signal 244 based on the received synchronization error signal 248 that generates the voltage droop indication signal 232 on the voltage droop output 234. If the adaptive control unit 252 determines that the delayed clock signal 202 should be provided as the reduced-frequency delayed clock signal 244, a reduced clock frequency signal 256 is generated on a reduced clock frequency output 258 that is received by the clock divider logic 254. The clock divider logic 254 will divide the received delayed clock signal 216 to provide the reduced-frequency delayed clock signal 244. The clock divider logic 254 will also generate a clock signal selector signal 260 on a clock selector output 262 to cause the clock signal selector 240 to provide the reduced-frequency delayed clock signal 244 on the second clock output 242 to the clocked circuit 204. However, if the adaptive control unit 252 determines that the delayed clock signal 202 should not be reduced in frequency, based on the received synchronization error signal 248 not indicating a voltage droop event, the adaptive control unit 252 will communicate the higher frequency change via the reduced clock frequency signal 256 to the clock divider logic 254 to generate the clock signal selector signal 260 on the clock selector output 262 to cause the clock signal selector 240 to provide the delayed clock signal 216 on the second clock output 242 to the clocked circuit 204.

As discussed above, the dynamic variation monitor 220 in the adaptive clock distribution system 200 in FIG. 2 is configured to detect the on-set of voltage droop in the power supply 206 based on timing transitions in one or more tunable delay paths whose delay is based on critical-path delay timings in the clocked circuit 204. In this regard, FIG. 3 is a schematic diagram of an exemplary dynamic variation monitor 220 that can be provided in the adaptive clock distribution system 200 in FIG. 2 to provide to illustrate detail of the tunable delay paths based on critical-path delay timings in the clocked circuit 204 and how the clock signal 212 being delayed in the tunable delay paths can be used to detect the on-set of a voltage droop in the power supply 206.

Figure 3:
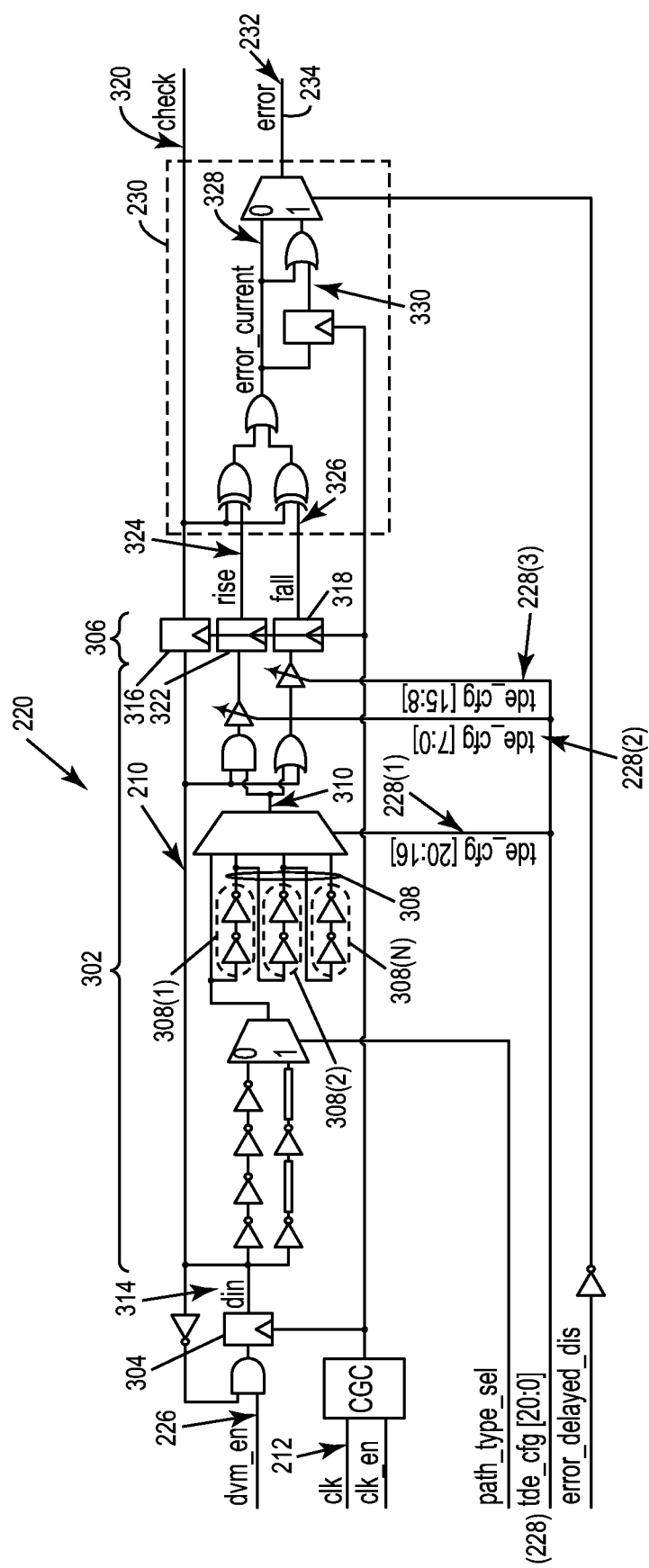
FIG. 3 is a schematic diagram of a dynamic variation monitor (DVM) provided in the adaptive clock distribution system in FIG. 2 for tracking critical-path timing changes in response to power supply variations to detect the onset of voltage droop in the power supply to trigger an adaptive response in the clocked circuit.

In this regard, with reference to FIG. 3, the dynamic variation monitor 220 contains a tunable path delay 302 between a driving flip-flop 304 and receiving flip-flops 306. The tunable path delay 302 comprises a plurality of tunable delay paths 308(1)-308(N) each having a delay timing based on a critical-path delay timing in the clocked circuit 204. The tunable path delay 302 is configured to delay the propagation of a data input signal 314 (din) from the driving flip-flop 304 to the inputs of the receiving flip-flops 306 by a selected tunable delay path among the plurality of tunable delay paths 308 based on the programmable delay path input 228 in the form of a configuration bits. In this example, the programmable delay path input 228 is provided as three different programmable delay path input ranges 228(1)-228(3), also known as configuration bits. Configuration bit 228(1), consisting of bits 20-16 of the programmable delay path input 228 in this example, provides a courser delay level setting of the tunable path delay 302. Configuration bits 228(2), 228(3) consisting of bits 15-8 and 7-0, respectively, of the programmable delay path input 228 in this example, provide a finer delay level setting for the tunable path delay 302, as will be discussed below. As will also be discussed in more detail below, the voltage droop detection circuit 230 is configured to generate the voltage droop indication signal 232 on the voltage droop output 234 indicating a voltage droop of the power supply 206 supplying power to the clocked circuit 204, based on timing differences between the period of the input clock signal 212 and the total path delay, including the driving flip-flop 304 clock-to-output delay, the tunable path delay 302, and the flip-flop 306 setup time.

More particularly in this example, with continuing reference to FIG. 3, when the enable signal 226 is high, the driving flip-flop 304 switches every clock cycle in response to receiving the clock signal 212. For a rising transition on a data input (din) of the driving flip-flop 304, the data input signal 314 propagates through the tunable path delay 302 to the input of a check flip-flop 316 and a fall flip-flop 318. The check flip-flop 316 samples the correct value of the driving flip-flop 304 output, which is the data input signal 314, every clock cycle of the clock signal 212 to generate a check signal 320. During a rising transition on the data input (din), the fall flip-flop 318 samples the correct value of the clock signal 212 to reset the fall flip-flop 318 for the next clock cycle with a falling transition on the data input signal 314. During a rising transition of the data input signal 314, the data input signal 314 propagates through the tunable path delay 302 to a rise flip-flop 322. On the next clock cycle of the clock signal 212, the voltage droop detection circuit 230 compares the check signal 320 with a rise signal 324 generated by the rise flip-flop 322. Note that the check signal 320 and a fall signal 326 generated by the fall flip-flop 318 are equal (e.g., logically high). If the check signal 320 and the rise signal 324 are equal, the voltage droop output 234 is low. If the rise signal 324 is logically low, this is an indication that the tunable delay path 302 did not satisfy the clock cycle time of the clock signal 212, and thus an error_current signal 328 is logically high, and the voltage droop indication signal 232 is generated as a logical high signal on the voltage droop output 234 to indicate a voltage droop in the power supply 206. During this clock cycle, a falling transition occurs on the data input (din), which then quickly traverses to the inputs of the check flip-flop 316 and the rise flip-flop 322, while the data input signal 314 propagates through the tunable path delay 302 to the fall flip-flop 318. On the next cycle of the clock signal 212, the dynamic variation monitor 220 compares the check and fall signals 320, 326. Since a late delay path could induce metastability on the rise and fall signals 324, 326 the dynamic variation monitor 220 provides a mode to generate the voltage droop output 234 as a logical-OR of the error_current signal 328 and the voltage droop indication signal in the previous cycle 330.

After the programmable delay path input 228 is calibrated during test of the adaptive clock distribution system 200 based on the critical-path timing delays in the clocked circuit 204, the dynamic variation monitor 220 in FIG. 3 tracks critical-path timing-margin changes in the clocked circuit 204 due to parameter variations that can change the critical-path timings. For example, such parameter variations can be due to environmental conditions such as temperature. If a voltage droop indication is generated on the voltage droop indication signal 232 by the dynamic variation monitor 220 due to a late timing transition of the second delayed signal 310 delayed in the tunable delay path 302, the dynamic variation monitor 220 also generates the voltage droop indication as the voltage droop indication signal 232 for the next clock cycle of the clock signal 212. Thus, the dynamic variation monitor 220 detects the onset of a voltage droop of the power supply 206 to trigger an adaptive response in the adaptive clock distribution system 200 in FIG. 3 to provide the reduced-frequency delayed clock signal 244 to be provided as the delayed clock signal 202 to the clocked circuit 204, as previously discussed above. Once the voltage droop is resolved at the power supply 206, the adaptive control unit 252 will cause the delayed clock signal 216 to be provided as the delayed clock signal 202 to the clocked circuit 204.

Figure 4:
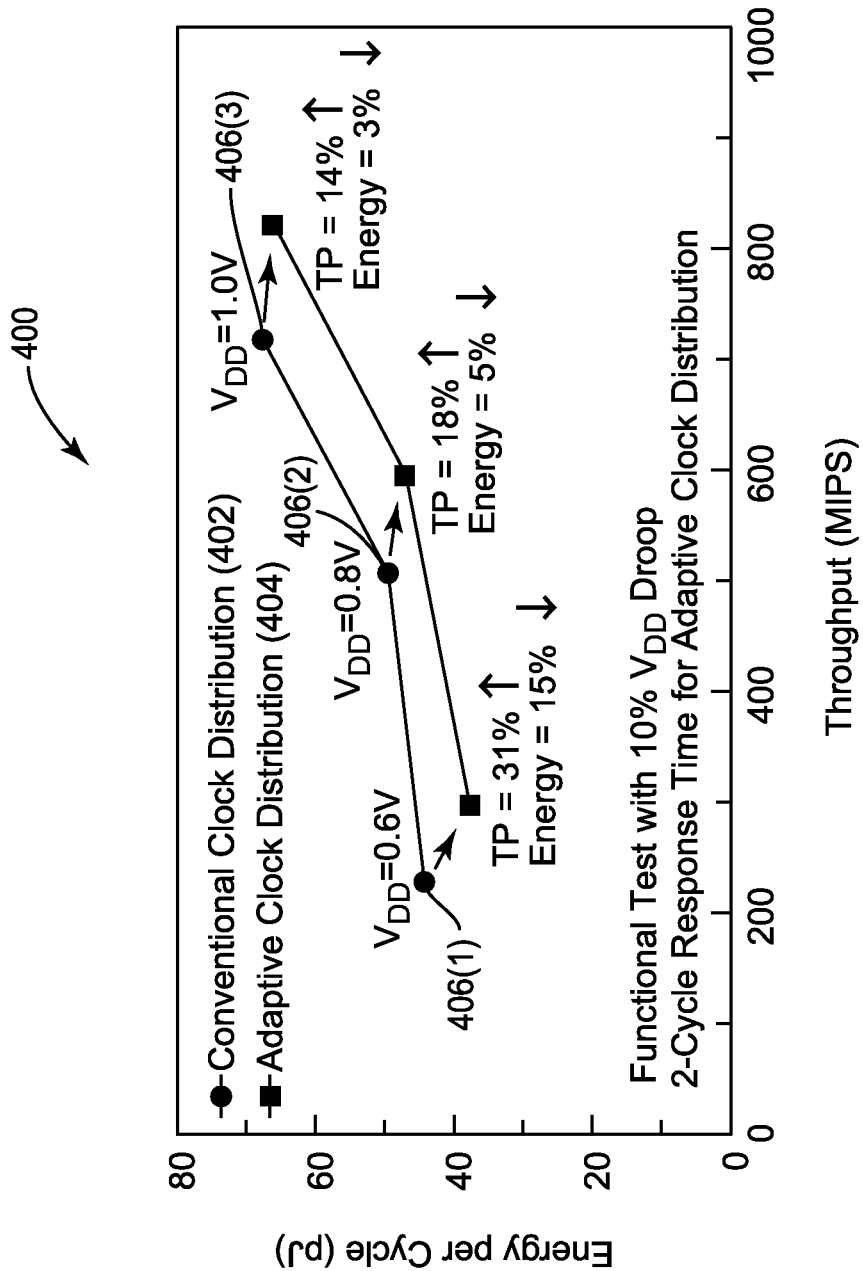
FIG. 4 is a graph illustrating exemplary plots of performance and energy consumption for an exemplary conventional clock distribution system and the adaptive clock distribution system in FIG. 2.

FIG. 4 is a graph 400 illustrating exemplary plots 402, 404 of performance and energy consumption for an exemplary conventional clock distribution system and the adaptive clock distribution system 200 in FIG. 2, respectively. As shown therein, by employing the adaptive clock distribution system 200 in FIG. 2, the plots 402, 402 include energy consumption per cycle and throughput in (in millions of instructions per section (MIPS) calculations for different voltage levels 406(1)-406(3) of the power signal 208 from the power supply 206. As shown in FIG. 4, by employing the adaptive clock distribution system 200 in FIG. 2, throughput increases for each voltage level 406(1)-406(3), because the delay margin provided in the dynamic variation monitor 220 of the adaptive clock distribution system 200 is configured based on process variations to be reduced as much as possible while still allowing for the adaptive clock distribution system 200 to properly detect and process voltage droop of the power supply 206. Further, in one example, because the adaptive clock distribution system 200 is located on-die with the clocked circuit 204, the adaptive clock distribution system 200 and the clocked circuit 204 will have experienced the same or similar process variations, this allows configuration of the timing margin of the dynamic variation monitor 220 to be configured and reduced even more precisely. Reducing the additional timing margin in the dynamic variation monitor 220 enables the adaptive clock distribution system 200 to mitigate a larger portion of the timing margin degradation in the clocked circuit 204 from a voltage droop, thus further increasing the throughput of the clocked circuit. Also shown in FIG. 4, the adaptive clock distribution system 200 reduces energy consumption, because tasks will be completed faster by the clocked circuit 204 due to the increased throughput of the clocked circuit 204.

In the dynamic variation monitor 220 in FIG. 3 discussed above, the tunable delay path 302 is configured during test. To provide for precise calibration, the adaptive clock distribution system 200 is calibrated for a wide range of operational and environmental conditions that are expected to be experienced by the adaptive clock distribution system 200 and the clocked circuit 204. However, this process is time consuming. Since the clocked circuit 204 may operate across a wide range of clock frequencies, operating voltages, and temperature conditions, this would require the dynamic variation monitor 220 to provide a unique set of calibration bits for the programmable delay path input 228 for each clock frequency, operating voltage, and temperature condition set point. An additional overhead would also be required to store the unique sets of calibration bits. Alternatively, the adaptive clock distribution system 200 could be calibrated during test for a more limited range of operational and environmental conditions during test to reduce calibration time. However, additional timing margin would have to be provided in the tunable delay path 302 of the dynamic variation monitor 220, because the tunable delay path 302 cannot account for all frequency, operating voltage, and temperature conditions. Adding additional timing margin in the tunable delay path 302 of the dynamic variation monitor 220 will reduce the throughput of the clocked circuit 204, and potentially cause the clocked circuit 204 to consume more energy.

Figure 5:
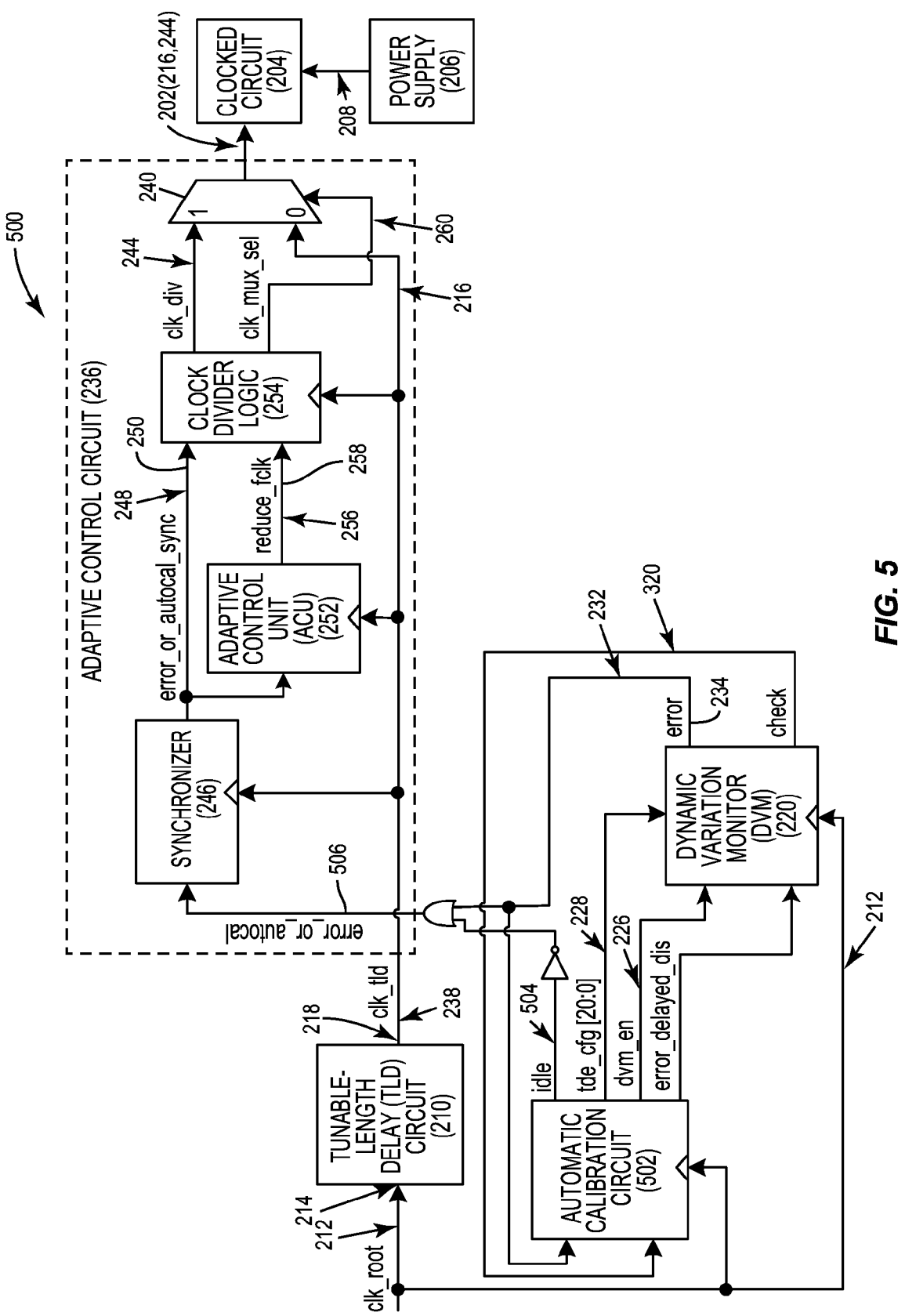
FIG. 5 is a block diagram of the exemplary adaptive clock distribution system in FIG. 2 that additionally includes an exemplary automatic calibration circuit to allow for operational calibration of the critical-path delays in the dynamic variation monitor to optimize the performance of the adaptive clock distribution system, while reducing or eliminating test time and memory overhead of post-silicon calibration during testing.

In this regard, FIG. 5 is a block diagram of an exemplary adaptive clock distribution system 500 that is the same as the adaptive clock distribution system 200 in FIG. 2, but additionally includes an exemplary automatic calibration circuit 502. As will be discussed in more detail below, providing the automatic calibration circuit 502 allows for operational calibration, including but not limited to in-field operational calibration, of the critical-path delays in the tunable delay path 302 of the dynamic variation monitor 220. This allows the timing margin of the dynamic variation monitor 220 to be reduced to optimize the performance of the adaptive clock distribution system 500, while reducing or eliminating test time and memory overhead of post-silicon calibration during testing. Common elements between the adaptive clock distribution system 500 in FIG. 5 and the adaptive clock distribution system 200 in FIG. 2 are shown in FIG. 5 with common element numbers as provided in the adaptive clock distribution system 200, and thus will not be re-described here.

Figure 6:
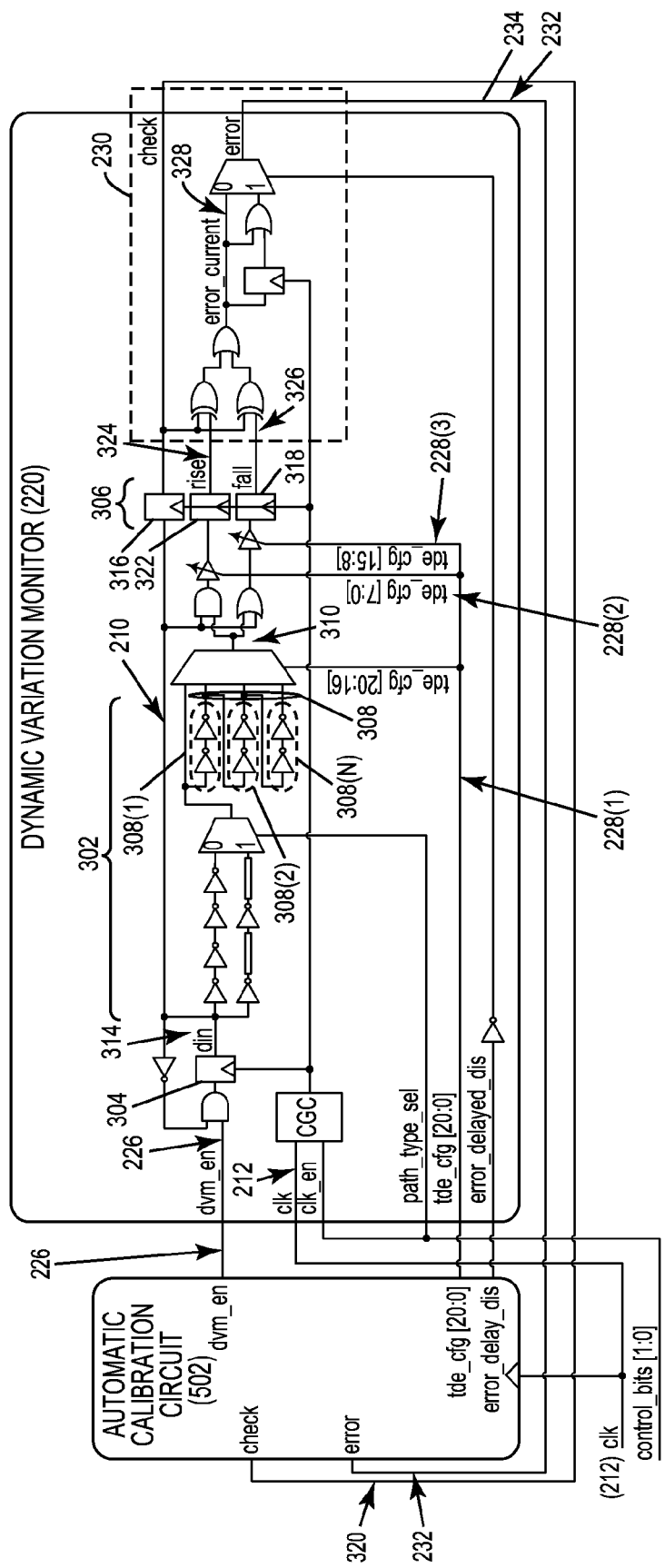
FIG. 6 is a schematic diagram of an automatic calibration circuit coupled to the dynamic variation monitor in the adaptive clock distribution system in FIG. 5.
Figure 7:
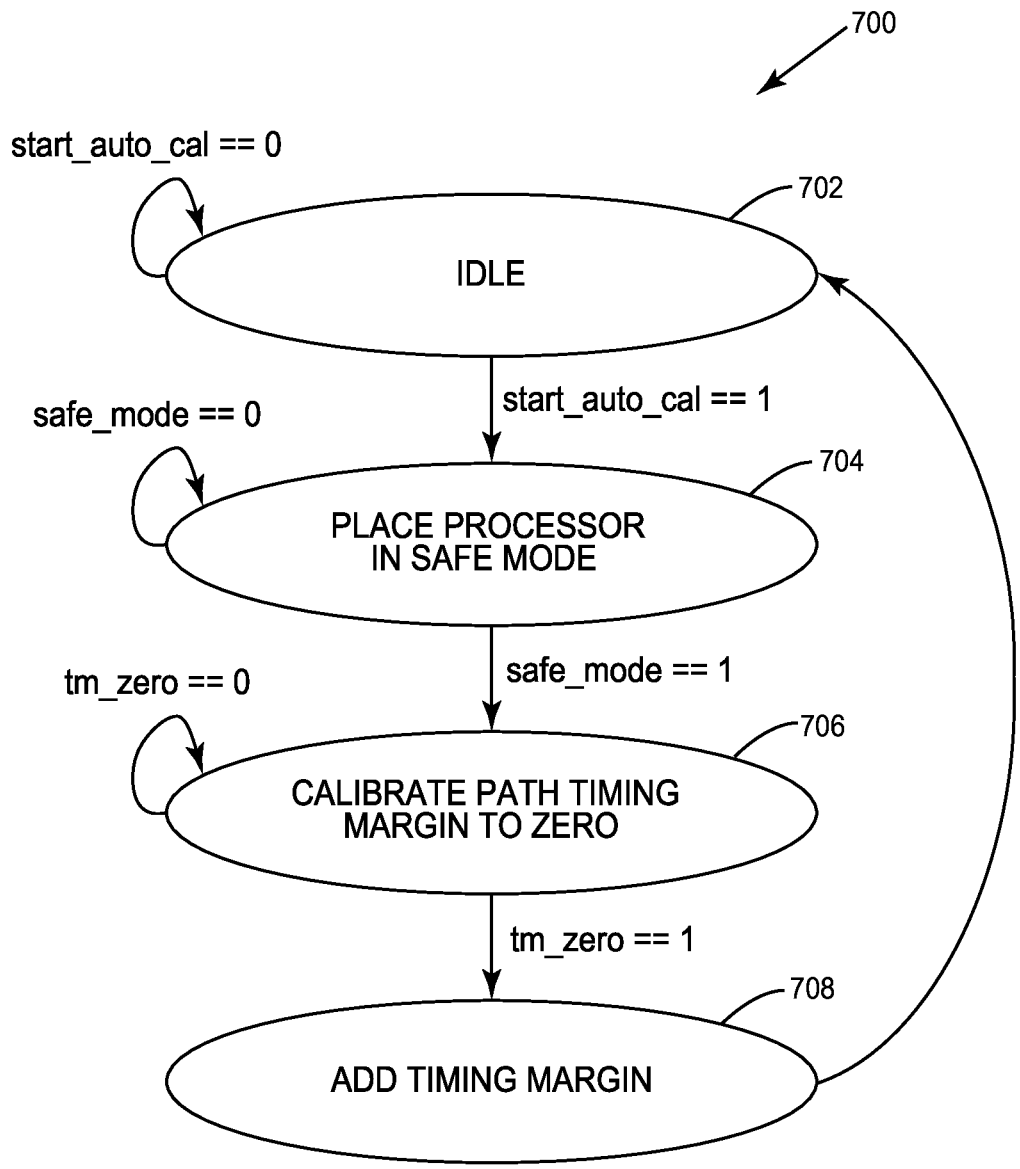
FIG. 7 is a state machine illustrating an exemplary operation of the automatic calibration circuit in the adaptive clock distribution system in FIG. 5, to provide for operational calibration of the critical-path delays in the dynamic variation monitor.

With continuing reference to FIG. 5, the automatic calibration circuit 502 interfaces with the dynamic variation monitor 220. As will be discussed in more detail below, the automatic calibration circuit 502 is configured to provide the programmable delay path input 228 to the dynamic variation monitor 220 to configure the delay of the tunable delay path 302 therein. As a non-limiting example, this allows the dynamic variation monitor 220 to be configured during in-field operations, in lieu of or in addition to during test of the adaptive clock distribution system 500. FIG. 6 is a schematic diagram illustrating more detail of the automatic calibration circuit 502 and its coupling to the dynamic variation monitor 220 in the adaptive clock distribution system 500 in FIG. 5. FIG. 7 is a finite state machine 700 illustrating an exemplary operation of the automatic calibration circuit 502 in the adaptive clock distribution system 500 in FIG. 5, to provide for operational calibration, including in-field operational calibration, of the critical-path delays in the dynamic variation monitor 220. FIG. 7 will be discussed now to describe the exemplary operation of the automatic calibration circuit 502.

In this regard, with reference to FIG. 7, the finite state machine 700 describes exemplary functionality for the automatic calibration circuit 502. The finite-state machine (FSM) 700 starts in an idle state 702 and remains in the idle state 702 until the clocked circuit 204 or software initiates automatic calibration of the dynamic variation monitor 220. Once the automatic calibration starts (i.e., start_auto_cal=1), a next state 704 places the clocked circuit 204 in a safe mode, since the automatic calibration circuit 502 cannot detect or respond to voltage droops of the power supply 206 during calibration in this example. In this regard, the automatic calibration circuit 502 transitions an idle signal 504 in FIG. 5 logically low, which forces a clock selection signal 506 (error_or_autocal) into the synchronizer 246 logically high. After two rising edges from the delayed clock signal 216 from the tunable-length delay circuit 210 are received, the synchronization error signal 248 (error_or_autocal_sync) transitions logically high, which reduces the frequency of the delayed clock signal 216 in half in this example, to provide the reduced-frequency delayed clock signal 244 to the clocked circuit 204. For this safe mode of operation, the reduced-frequency delayed clock signal 244 drives the clocked circuit 204 while the dynamic variation monitor 220 still receives the higher frequency clock signal 212 during calibration. An alternative safe mode operation could force the clocked circuit 204 to execute no-operation (NOP) instructions during the automatic calibration. As discussed further in the next paragraph, an exemplary performance penalty of placing the clocked circuit 204 in a safe mode is negligible (e.g., 0.02%) if long durations occur between calibration sequences of the dynamic variation monitor 220.

With continuing reference to FIG. 7, after placing the clocked circuit 204 in a safe mode (i.e., safe_mode=1) in state 704, a next state 706 tunes the timing margin of the tunable delay path 302 of the dynamic variation monitor 220 to approximately zero ($T_{CLK}-T_{PATH} \sim 0$ ps), where $T_{CLK}$ is the clock period ($T_{CLK}=1/F_{CLK}$) of the clock signal 212 and $T_{PATH}$ is the tunable delay path 302 path delay, including the drive flip-flop 304 clock-to-output delay and the receiving flip-flop setup time. This automatic calibration design observes the voltage droop indication signal 232 generated by the dynamic variation monitor 220 to guide the delay-path configuration settings to determine the calibration point for a zero margin additional delay. The algorithm for tuning the timing path margin to zero or nearly zero may consist of a binary search, a unidirectional search, or a combination of both, depending on the operation of the configuration bits 228(1)-228(3) in the dynamic variation monitor 220.

With continuing reference to FIG. 7, after the delay-path configuration settings achieve a nearly zero timing margin (i.e., tm_zero=1), a next state 708 adds timing margin back to the tunable delay path 302 of the dynamic variation monitor 220. The design for the automatic calibration circuit 502 may require that an additional small timing margin be added by configuration of the tunable delay path 302 in the dynamic variation monitor 220 to ensure the automatic calibration circuit 502 does not react to frequent small magnitude voltage droops in the power supply 206. The additional timing margin in this example results from removing a number of delay elements in the tunable delay path 302 via the configuration bits 228(1)-228(3) in the programmable delay path input 228. Finally, the finite state machine 700 transitions back to the idle state 702 and holds the configuration bits 228(1)-228(3) settings until the clocked circuit 204 initiates another automatic calibration sequence of the dynamic variation monitor 220. The dynamic variation monitor 220 may require calibration for many different scenarios, including after the clocked circuit 204 reboots, wakes up from sleep mode, or a long-duration change in operating frequency, operating voltage, and/or temperature conditions.

Thus, with the automatic calibration circuit 502 provided in the adaptive clock distribution system 500 in FIG. 5, an exponential reduction in calibration time may be realized as compared to traditional post-silicon calibration at test. Since the automatic calibration circuit 502 can be located on-die with the dynamic variation monitor 220 and directly interfaces with the dynamic variation monitor 220, the latency for tuning the tunable delay path 302 of the dynamic variation monitor 220 may range between ~50 to ~200 clock cycles of the clock signal 212, as a non-limiting example, depending on the calibration algorithm and the number of configuration bits 228(1)-228(3). Furthermore, the calibration may be designed to execute at a target clock frequency of the clock signal 212 (e.g., 1-3 GHz for a high-performance clocked circuit 204), and thus the calibration time for a high-performance clocked circuit 204 may only range from ~17 ns to ~200 ns as an example. In comparison, traditional post-silicon calibration at test typically requires either software commands to an on-die co-processor or a software test interface to the on-die Joint Test Action Group (JTAG) scan interface, thus requiring ~1,000,000's of cycles for calibration latency while operating at a slow JTAG clock signal of ~100 MHz. Traditional calibration at test may require ~10 ms, which is ~10,000 to ~100,000 times longer than the exemplary automatic calibration circuit 502 in FIG. 5. In addition, the clocked circuit 204 can initiate a new automatic calibration sequence at long time intervals due to a change in either voltage of the power signal 208 and/or the clock signal 212 from dynamic voltage frequency scaling (DVFS), or to mitigate the effect of slow-changing parameter variations. For this reason, the minimum delay between calibration sequences is ~1 ms, resulting in a worst-case performance penalty of ~0.02% (=100×200 ns/1 ms) for placing the clocked circuit 204 in a safe mode during the calibration sequence.

Figures 8A, 8B:
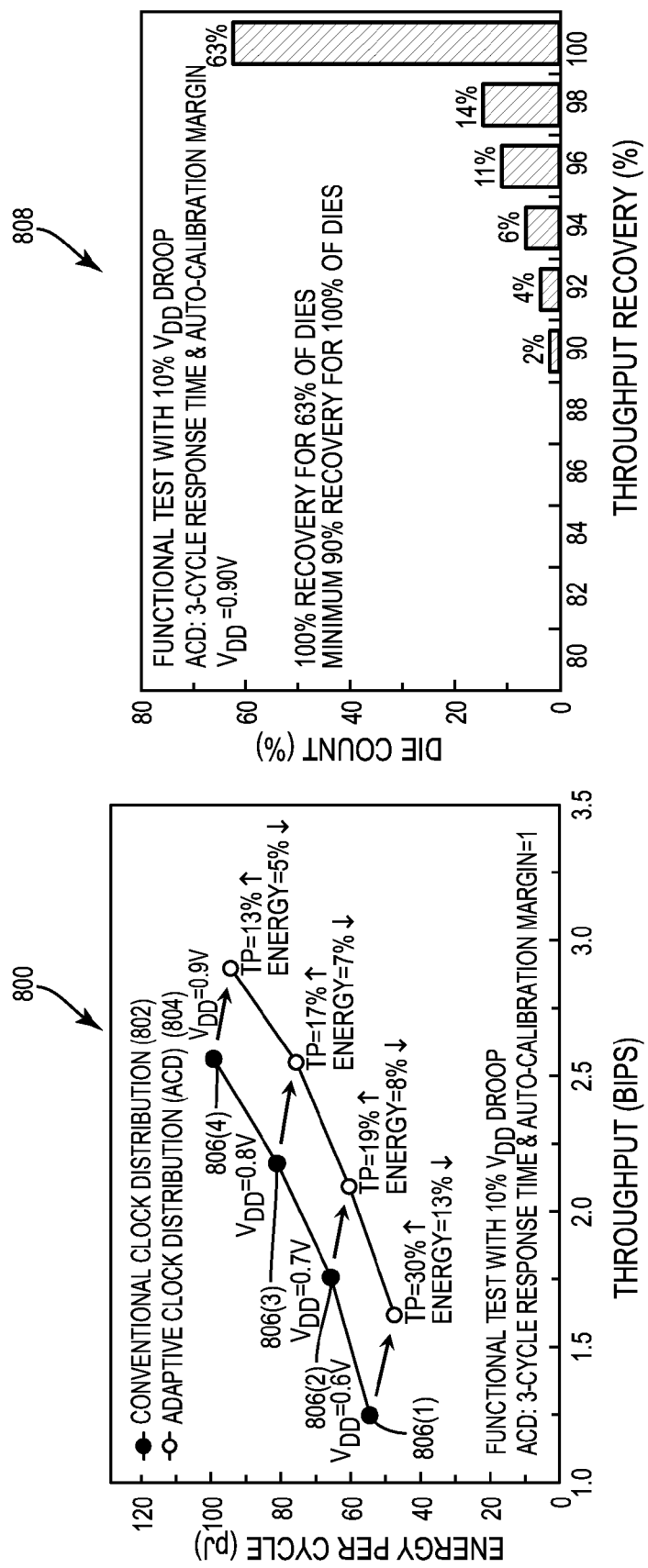
FIG. 8A is a graph illustrating exemplary plots of performance and energy consumption of the adaptive clock distribution system in FIG. 5 employing the additional automatic calibration circuit.
FIG. 8B is a graph illustrating exemplary plots of the die probability distribution of throughput recovery for the adaptive clock distribution system in FIG. 5 employing the additional automatic calibration circuit for a given voltage droop.

FIG. 8A is a graph 800 illustrating exemplary plots 802, 804 of performance and energy consumption for the adaptive clock distribution system 500 in FIG. 5, with the addition of the automatic calibration circuit 502. As shown in FIG. 8A, by employing the adaptive clock distribution system 500 with the automatic calibration circuit 502 in FIG. 5, the plots 802, 804 include energy consumption per cycle and throughput (in millions of instructions per section (MIPS) calculations for different voltage levels 806(1)-806(4) of the power signal 208 from the power supply 206. As shown in FIG. 8A, throughput increases for each voltage level 806(1)-806(4), because the timing margin provided in the dynamic variation monitor 220 of the adaptive clock distribution system 500 is configured based on process variations to be reduced as much as possible while still allowing for the adaptive clock distribution system 500 to properly detect and process voltage droop of the power supply 206.

As cores operate with dynamic supply voltage ($V_{DD}$) and clock frequency ($F_{CLK}$) scaling and experience process variations, the automatic calibration circuit 502 optimally configures the dynamic variation monitor 220 to maximize the adaptive clock distribution system 500 benefits. With continuing reference to FIG. 8A with a $V_{DD}$ of 0.9V, with the conventional clock distribution, after injecting an exemplary 10% $V_{DD}$ droop, the maximum clock frequency ($F_{Max}$) reduces from 2.95 GHz to 2.56 GHz, corresponding to a normalized throughput (TP) of one. After the automatic calibration circuit 502 executes the FSM 700 in FIG. 7, at a target $F_{CLK}$ of 2.95 GHz with a margin of 0, employing the adaptive clock distribution system 500 enables a higher $F_{CLK}$ and throughput by detecting the droop and operating at ½$F_{CLK}$ during the droop. The maximum throughput gain of 10% occurs at 2.83 GHz in this example. Although the adaptive clock distribution system 500 maintains correct operation beyond this $F_{CLK}$, a larger $F_{CLK}$ reduces the throughput due to the increasing number of cycles at ½$F_{CLK}$. When the automatic calibration circuit 502 applies a margin of 1 large TDE, the adaptive clock distribution (ACD) recovers the entire $F_{MAX}$ degradation for a maximum throughput gain of 13%. These measurements in FIG. 8A demonstrate the simultaneous throughput gains and energy reductions ranging from 13% and 5% at 0.9V to 30% and 13% at 0.6V in this example for the adaptive clock distribution system 500. As shown in a graph 808 in FIG. 8B, for this example, after a given number of die measurements, the adaptive clock distribution system 500 with a margin of 1 large TDE recovers 100% of the throughput loss due to a 10% $V_{DD}$ droop for 63% of the dies and a minimum of 90% throughput recovery for all dies. The adaptive clock distribution system 500 in FIG. 5 employing the automatic calibration circuit 502, and related systems and methods disclosed herein, may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
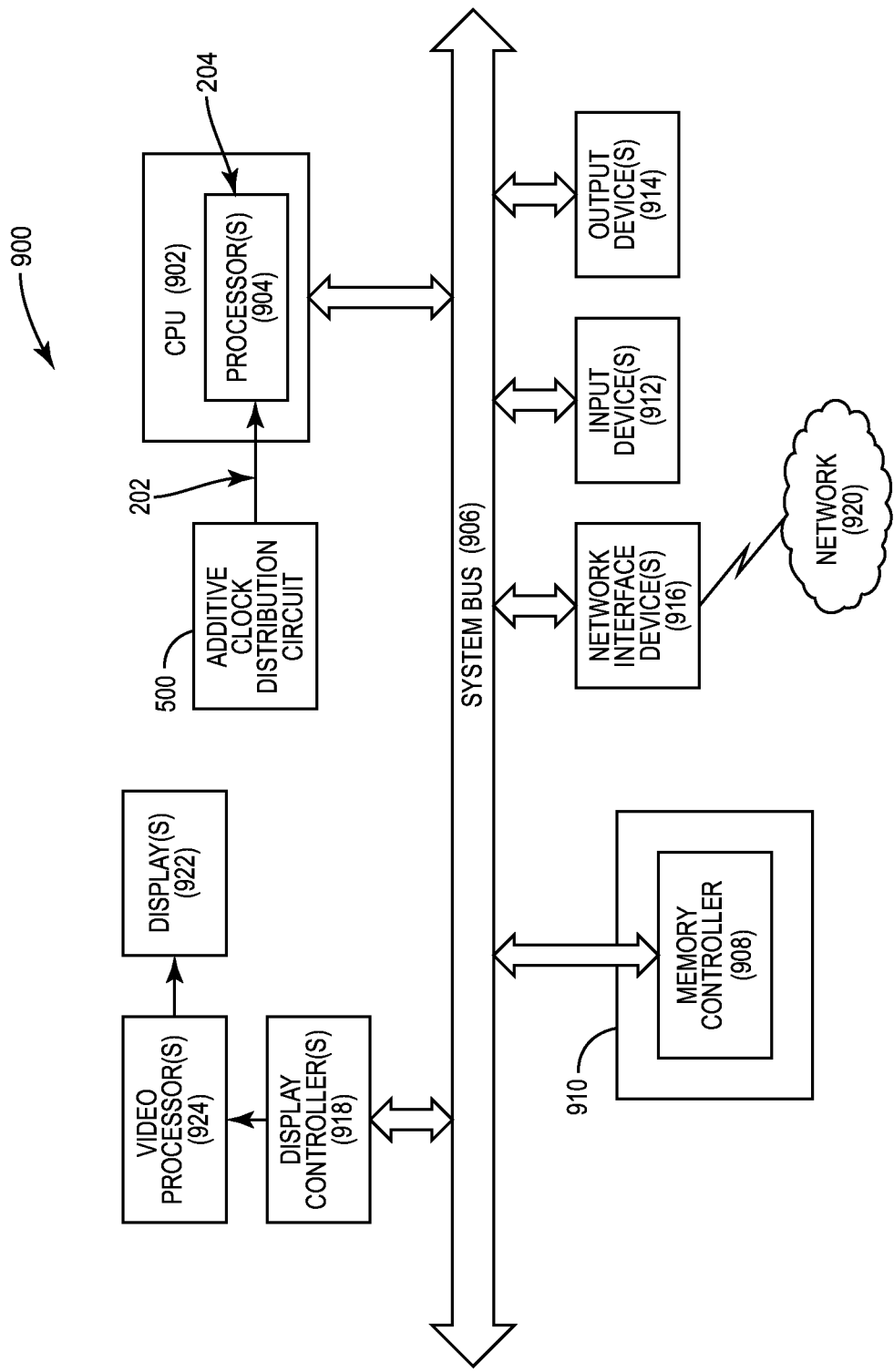
FIG. 9 is a block diagram of an exemplary processor-based system that can include the adaptive clock distribution system described herein to allow for operational calibration of the critical-path delays in the dynamic variation monitor, which tracks critical-path timing changes in response to power supply variations to detect the onset of voltage droop in the power supply to trigger an adaptive response in a processor.

In this regard, FIG. 9 is a block diagram of an exemplary processor-based system 900 that can include the adaptive clock distribution system 500 in FIG. 5 to allow for operational calibration, including in-field operational calibration, of the critical-path delays in the dynamic variation monitor 220, which tracks critical-path timing changes in response to the power supply 206 variations to detect the onset of voltage droop in the power supply 206 to trigger an adaptive response. In this example, the processor-based system 900 includes one or more CPUs 902, each including one or more processors 904. The CPU(s) 902 is coupled to a system bus 906. As is well known, the CPU(s) 902 communicates with these other devices by exchanging address, control, and data information over the system bus 906. For example, the CPU(s) 902 can communicate bus transaction requests to a memory controller 908 for memory accesses to a memory system 910. Although not illustrated in FIG. 9, multiple system buses 906 could be provided, wherein each system bus 906 constitutes a different fabric.

Other master and slave devices can be connected to the system bus 906. As illustrated in FIG. 9, these devices can include the memory system 910, one or more input devices 912, one or more output devices 914, one or more network interface devices 916, and one or more display controllers 918, as examples. The input device(s) 912 can include any type of input device, including but not limited to input keys, switches, voice processors, etc. The output device(s) 914 can include any type of output device, including but not limited to audio, video, other visual indicators, etc. The network interface device(s) 916 can be any devices configured to allow exchange of data to and from a network 920. The network 920 can be any type of network, including but not limited to a wired or wireless network, a private or public network, a local area network (LAN), a wide local area network (WLAN), and the Internet. The network interface device(s) 916 can be configured to support any type of communications protocol desired.

The CPU(s) 902 may also be configured to access the display controller(s) 918 over the system bus 906 to control information sent to one or more displays 922. The display controller(s) 918 sends information to the display(s) 922 to be displayed via one or more video processors 924, which process the information to be displayed into a format suitable for the display(s) 922. The display(s) 922 can include any type of display, including but not limited to a cathode ray tube (CRT), a liquid crystal display (LCD), a light emitting diode (LED) display, a plasma display, a two dimensional (2-D) display, a three dimensional (3-D) display, a touch-screen display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An adaptive clock distribution system for delaying a clock signal provided to a clocked circuit, comprising:
    a dynamic variation monitor, comprising:
        a first clock signal input configured to receive a clock signal;
        a tunable delay circuit comprising a plurality of tunable delay paths each having a delay timing based on a critical-path delay timing in a clocked circuit;
            the tunable delay circuit further configured to measure a timing margin between a clock signal period of the clock signal and a path delay of a data input signal delayed in a selected tunable delay path among the plurality of tunable delay paths based on a programmable delay path input; and
        a voltage droop detection circuit configured to detect a voltage droop of a power supply supplying power to the clocked circuit, and generate a voltage droop output indicating a voltage droop event of the power supply, based on the measured timing margin between the clock signal period and the path delay of the data input signal;
    an adaptive control circuit configured to:
        receive a first delayed clock signal comprised of a delayed clock signal of the clock signal on a second clock signal input;
        reduce a frequency of the first delayed clock signal to provide a reduced frequency delayed clock signal;
        receive the voltage droop output from the dynamic variation monitor;
        selectively provide the reduced frequency delayed clock signal on a second clock output to the clocked circuit if the voltage droop output indicates the voltage droop event; and
        selectively provide the first delayed clock signal on the second clock output to the clocked circuit if the voltage droop output does not indicate the voltage droop event; and
    an automatic calibration circuit configured to generate the programmable delay path input to select the selected tunable delay path among the plurality of tunable delay paths in the dynamic variation monitor that produces a lower path timing margin of the clock signal period and the path delay of the data input signal in the dynamic variation monitor without the voltage droop event being generated on the voltage droop output.

2. The adaptive clock distribution system of claim 1, wherein the automatic calibration circuit is configured to generate the programmable delay path input during in-field operation of the adaptive clock distribution system.

3. The adaptive clock distribution system of claim 1, wherein:
    the dynamic variation monitor is further configured to receive configuration bits in the programmable delay path input to select the selected tunable delay path among the plurality of tunable delay paths; and
    the automatic calibration circuit is further configured to provide the configuration bits in the programmable delay path input to cause the dynamic variation monitor to select the selected tunable delay path.

4. The adaptive clock distribution system of claim 1, wherein the automatic calibration circuit is further configured to tune a delay setting in the programmable delay path input to tune a delay in the selected tunable delay path.

5. The adaptive clock distribution system of claim 4, wherein:
    the automatic calibration circuit is further configured to provide the configuration bits in the generated programmable delay path input to cause the dynamic variation monitor to tune the delay in the selected tunable delay path; and
    the dynamic variation monitor is further configured to receive configuration bits in the programmable delay path input to tune the delay in the selected tunable delay path among the plurality of tunable delay paths.

6. The adaptive clock distribution system of claim 4, wherein the automatic calibration circuit is further configured to generate the programmable delay path input to tune the selected tunable delay path in the dynamic variation monitor to provide a reduced timing margin between the clock signal period and the path delay of the data input signal.

7. The adaptive clock distribution system of claim 6, wherein the reduced timing margin is comprised of an approximate zero timing margin.

8. The adaptive clock distribution system of claim 6, wherein the automatic calibration circuit is configured to tune the selected tunable delay path to provide the reduced timing margin between the clock signal period and the path delay of the data input signal based on the voltage droop output.

9. The adaptive clock distribution system of claim 1, wherein the adaptive control circuit is configured to enter a safe mode after being initiated to calibrate the dynamic variation monitor.

10. The adaptive clock distribution system of claim 9, wherein the adaptive control circuit further comprises a clock signal selector configured to selectively provide either the reduced frequency delayed clock signal or the first delayed clock signal to the second clock output based on a received frequency input signal.

11. The adaptive clock distribution system of claim 1, wherein the automatic calibration circuit is configured to generate a clock selection signal in the safe mode to cause the adaptive control circuit to cause the clock signal selector to provide the reduced frequency delayed clock signal on the second clock output to the clocked circuit.

12. The adaptive clock distribution system of claim 11, wherein the adaptive control circuit is configured to cause the clock signal selector to provide the reduced frequency delayed clock signal at a frequency of approximately half of the frequency of the first delayed clock signal on the second clock output to the clocked circuit.

13. The adaptive clock distribution system of claim 9, wherein the automatic calibration circuit is configured to cause the clocked circuit to execute no operation instructions (NOPs) in the safe mode.

14. The adaptive clock distribution system of claim 6, wherein the automatic calibration circuit is configured to tune the selected tunable delay path to increase the reduced timing margin between the clock signal period and the selected tunable path delay based on the voltage droop output.

15. The adaptive clock distribution system of claim 14, further comprising a tunable-length delay circuit comprising:
   a third clock signal input configured to receive the clock signal; and
   a delay circuit configured to delay the received clock signal to provide the first delayed clock signal.

16. The adaptive clock distribution system of claim 1, further comprising a driving flip-flop clocked by the clock signal, the driving flip-flop configured to generate the data input signal.

17. The adaptive clock distribution system of claim 1 integrated into an integrated circuit (IC).

18. The adaptive clock distribution system of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

19. An adaptive clock distribution system for delaying a clock signal provided to a clocked circuit, comprising:
   a means for measuring a timing margin between a clock signal period of a clock signal and a path delay of a data input signal in a selected tunable delay path among a plurality of tunable delay paths each having a delay timing based on a critical-path delay timing in a clocked circuit, based on a programmable delay path input;
   a means for detecting a voltage droop event on a voltage droop output indicating a voltage droop of a power supply supplying power to the clocked circuit, based on the measured timing margin between the clock signal period and the path delay of the data input signal;
   a means for:
      receiving a first delayed clock signal comprised of a delayed clock signal of the clock signal on a second clock signal input;
      reducing a frequency of the first delayed clock signal to provide a reduced frequency delayed clock signal;
      selectively providing the reduced frequency delayed clock signal on a second clock output to the clocked circuit if the voltage droop output indicates the voltage droop event; and
      selectively providing the first delayed clock signal on the second clock output to the clocked circuit if the voltage droop output does not indicate the voltage droop event; and
   a means for providing the programmable delay path input to the means for measuring the timing margin to select the selected tunable delay path among the plurality of tunable delay paths in the means for measuring the timing margin that produces a lower path timing margin of the clock signal period and the path delay of the data input signal in the means for measuring the timing margin without the voltage droop event being generated by the means for detecting the voltage droop event.

20. A method of adaptively distributing a delayed clock signal to a clocked circuit, comprising:
   receiving a clock signal;
   measuring a timing margin of a clock signal period of the clock signal and a path delay of a data input signal in a selected tunable delay path among the plurality of tunable delay paths each having a delay timing based on a critical-path delay timing in a clocked circuit, based on a programmable delay path input;
   detecting a voltage droop event of a power supply supplying power to a clocked circuit;
   generating a voltage droop output indicating the voltage droop event based on the measured timing margin of the clock signal period and the path delay of the data input signal;
   selectively providing a reduced frequency delayed clock signal of the clock signal to the clocked circuit if the voltage droop output indicates the voltage droop event;
   selectively providing a first delayed clock signal on a second clock output to the clocked circuit if the voltage droop output does not indicate the voltage droop event;
   calibrating the plurality of tunable delay paths based on the programmable delay path input, based on the selected tunable delay path among the plurality of tunable delay paths that produces a lower path timing margin of the clock signal period and the path delay of the data input signal without the voltage droop event being generated on the voltage droop output; and
   generating the programmable delay path input to select the selected tunable delay path among the plurality of tunable delay paths during operation of the clocked circuit, based on the calibrating of the plurality of tunable delay paths.

21. The method of claim 20 comprising generating the programmable delay path input during in-field operation.

22. The method of claim 20, wherein:
   generating the programmable delay path input further comprises providing configuration bits in the programmable delay path input to select the selected tunable delay path; and
   measuring the timing margin of the clock signal period and the path delay of the data input signal further comprises measuring the timing margin of the clock signal period and the path delay of the data input signal in the selected tunable delay path among the plurality of tunable delay paths, based on the configuration bits in the programmable delay path input.

23. The method of claim 20, wherein generating the programmable delay path input further comprises tuning a delay setting in the selected tunable delay path to tune a delay in the selected tunable delay path.

24. The method of claim 23, wherein:
   generating the programmable delay path input further comprises providing configuration bits in the programmable delay path input to select the selected tunable delay path; and
   measuring the timing margin of the clock signal period and the path delay of the data input signal further comprises measuring the timing margin of the clock signal period and the path delay of the data input signal in the selected tunable delay path among the plurality of tunable delay paths, based on the configuration bits to tune the delay in the selected tunable delay path among the plurality of tunable delay paths.

25. The method of claim 23, wherein generating the programmable delay path input further comprises generating the programmable delay path input to tune the selected tunable delay path to provide a reduced timing margin between the clock signal period and the path delay of the data input signal.

26. The method of claim 25, wherein the reduced timing margin is comprised of an approximate zero timing margin.

27. The method of claim 25, wherein tuning the selected tunable delay path comprises tuning the selected tunable delay path to provide the reduced timing margin between the clock signal period and the path delay of the data input signal based on the voltage droop output.

28. The method of claim 20, further comprising entering a safe mode after being initiated to calibrate the selected tunable delay path among the plurality of tunable delay paths based on the programmable delay path input.

29. The method of claim 28, further comprising clock signal selector selectively providing either the reduced frequency delayed clock signal or the first delayed clock signal to the second clock output based on a received frequency input signal.

* * * * *